United States Patent [19]
Ker et al.

[11] Patent Number: 5,714,784
[45] Date of Patent: Feb. 3, 1998

[54] ELECTROSTATIC DISCHARGE PROTECTION DEVICE

[75] Inventors: Ming-Dou Ker; Chung-Yu Wu, both of Hsin-Chu; Chien-Chang Huang, Changhua; Chau-Neng Wu, Kaohsiung Hsien; Ta-Lee Yu, Hsin-Chu Hsien, all of Taiwan

[73] Assignee: Winbond Electronics Corporation, Hsin-chu, Taiwan

[21] Appl. No.: 545,286

[22] Filed: Oct. 19, 1995

[51] Int. Cl.$^6$ .......................... H01L 23/62; H01L 29/76
[52] U.S. Cl. .......................... 257/360; 257/401
[58] Field of Search .......................... 257/360, 401, 257/205, 206

[56] References Cited

U.S. PATENT DOCUMENTS

| | | | |
|---|---|---|---|
| 5,218,222 | 6/1993 | Roberts et al. | 257/362 |
| 5,270,565 | 12/1993 | Lee et al. | 257/358 |
| 5,272,371 | 12/1993 | Bishop et al. | 257/362 |
| 5,404,041 | 4/1995 | Diaz et al. | 257/360 |

FOREIGN PATENT DOCUMENTS

| | | | |
|---|---|---|---|
| 2-105579 | 4/1990 | Japan | 257/205 |
| 4-27159 | 1/1992 | Japan | 257/206 |

OTHER PUBLICATIONS

C. Duvvury and A. Amerasekera, "ESD: A pervasive reliability concern for IC technologies", Proceedings of the IEEE, vol. 81, No. 5, May 1993.

A. Amerasekera and C. Duvvury, "The impact of technology scaling on ESD robustness and protection circuit design", EOS/ESD Symp. Proc., EOS-16, pp. 237-245, 1994.

C. H. Diaz, T.E. Kopley and P.J. Marcoux, "Building-in ESD/EOS reliability for sub-halfmicron CMOS Processes", Proc. of IRPS, pp. 276-283, 1995.

L. Baker, R. Currence, S. Law, M. Le, S.T. Lin, and M. Teene, "A waffle layout technique strengthens the ESD hardness of the NMOS output transistor", EOS/ESD Symp. Proc., EOS-11, pp. 175-181, 1989.

R. Vemuru, "Layout comparison of MOSFETs with large W/L ratios", Electronics Letters, vol. 28, No. 25, pp. 2327-2329, 1992.

S. Daniel and G. Krieger, "Process and design optimization for advanced CMOS I/O ESD protection devices", EOS/ESD Symp. Proc., EOS-12, pp. 206-213, 1990.

*Primary Examiner*—Steven H. Loke
*Attorney, Agent, or Firm*—Christie, Parker & Hale, LLP

[57] ABSTRACT

The present invention is an electronic device, and more particularly an MOS transistor. A square-type layout style is used to realize the MOS device. By using the present layout style, the output driving/sinking capability of output buffers as well as the ESD protection capability of NMOS and PMOS devices in output buffers or input ESD protection circuits are significantly improved within smaller layout area. Both drain diffusion area and drain-to-bulk parasitic capacitance at the output node are reduced by this square-type layout. Devices using the present layout style can be assembled to form larger, rectangular (or square) and similarly functioning devices. Thus, the present square-type layout style is very attractive to submicron CMOS VLSI/ULSI in high-density and high-speed applications.

9 Claims, 11 Drawing Sheets

ELECTROSTATIC DISCHARGE PROTECTION DEVICE

FIELD OF THE INVENTION

This invention is an electronic device, and more particularly an MOS transistor which has loop-shaped source and gate and which can be assembled into larger and similarly functioning devices. When this invention is implemented into integrated circuits, the output driving/sinking capability of output buffers as well as the ESD protection capability of NMOS and PMOS devices in output buffers or input ESD protection circuits are significantly improved with smaller layout area.

BACKGROUND OF THE INVENTION

As CMOS technology is scaled down into submicron regime, the advanced processes, such as thinner gate oxide, shorter channel length, shallower source/drain junction, LDD (Lightly-Doped Drain) structure, and silicided diffusion, severely degrade ESD (Electrostatic Discharge) robustness of submicron CMOS IC's. To achieve the same required ESD robustness, the ESD protection devices in submicron CMOS circuits often need to be designed with much larger dimensions than those in traditional long-channel CMOS technologies. Besides, in order to offer enough driving/sinking capability of CMOS output buffers to drive heavy output load, the width/length (W/L) ratios of NMOS and PMOS devices in the last stage of output buffer which is directly connected to the output pad are generally increased up to several hundred. The pin counts of submicron CMOS IC's are often more than 200 and the pad pitch is reduced to around 100 micrometers. Since the number of pins that require input (or output) ESD protection circuit (or output buffer) is so many, the layout area available for each input (or output) pad with the ESD protection circuit (or output buffer) including latchup guard rings is, therefore, very limited. Even if the traditional finger-type layout style was adopted to draw large-dimension NMOS and PMOS devices, the total layout area of input or output pads, ESD protection circuits, output buffers, and latchup guard rings are still requested to be reduced in submicron CMOS IC's.

In 1989, Baker et al. proposed a waffle (rectangular) layout style to enhance ESD hardness of NMOS output transistor in "A waffle layout technique strengthens the ESD hardness of the NMOS output transistor". The Waffle layout style was shown to offer better ESD protection capability than that in the finger-type layout style wig the same layout area. In 1992, Vemuru made a comparison between the finger-type and waffle-type layout in "Layout comparison of MOSFETs with large W/L ratios". He found that waffle-type layout contributed about 10% area reduction compared to that of finger-type one, as well as the waffle-type layout produced lower gate resistance suitable for wide-band or low-noise applications.

Recently, some efforts have been made to investigate the relations between layout parameters and ESD hardness in thin-oxide NMOS or PMOS devices of submicron CMOS technologies. It is found that the spacing from drain contact to the edge of gate oxide is an important parameter for the ESD protection capability of thin-oxide devices as disclosed in "Process and design optimization for advanced CMOS I/O ESD protection devices" by S. Daniel and G. Krieger, and "Source contact placement for efficient ESD/EOS protection in grounded substrate MOS integrated circuit" by C. Diaz, C. Duvvury and S. M. Kang (U.S. Pat. No. 5,404,041). Larger spacing from drain contact to gate-oxide edge leads to higher ESD protection capability. This minimum spacing is found to be about 5–6 micrometers in submicron CMOS technologies to sustain better ESD protection with little without much increase in layout area. In the waffle-style layout, the spacing of the gate-oxide edge to the source contact and that to the drain contact are the same: about 5–μm. In the traditional finger-type layout, the spacing of the gate-oxide edge to the drain contact is also about 5–6 μm but that to the source contact can be reduced to be only 1 micrometer in submicron CMOS technologies. With this spacing constraint of drain contact to its gate-oxide edge. the waffle style will occupy more layout area than the traditional finger-type under the same W/L ratio.

There are other works proposed to enhance ESD robustness of output buffers such as "Output ESD protection circuit" by N. Roberts (U.S. Pat. No. 5,218,222, 1993) and "Electro-static discharge protection circuit with bimodal resistance characteristics" by F. V. Lee, A. Lee, M. L. Marmet, and K. W. Ouyang (U.S. Pat. No. 5,270,565). In U.S. Pat. No. 5,218,222, a polyresistor is inserted between an output buffer and an output pad with an additional lateral n-p-n bipolar transistor in shunt with the NMOS device to ground. In U.S. Pat. No. 5,270,565, an extended resistive structure is used to form the drain of NMOS device in CMOS output buffer with an additional thick-oxide device in shunt with NMOS to ground. These added resistor, lateral bipolar transistor, or thick-oxide device contribute extra RC delay to the path from the output buffer to the pad. Although the ESD protection may be enhanced, the output driving/sinking capability and timing may suffer when compared to the original design specification.

The traditional finger-type style for NMOS device uses the n-well/p-substrate CMOS process. This $P^+$ diffusion 44 surrounds the entire NMOS device. There is an $N^+$ diffusion 45 surrounding this $P^+$ diffusion 44 and connected to a voltage supply (VDD). This $N^+$ diffusion 45 to the poly-gate edge is "d". The spacing from the source contact 15 to the poly-gate edge 11 is "s". For better ESD robustness of CMOS output buffer in submicron CMOS technologies, this spacing d is found to be about 5–6 μm. But, the spacing s does not have much effect on the ESD reliability of CMOS output buffer. This spacing s is typically 1 μm in the device layout. Outside the source region 13 there are two latchup guard rings surrounding the entire NMOS device. One is the $P^+$ diffusion 16 connected to ground (GND) to offer substrate bias and the other is the $N^+$ diffusion 17 connected to a voltage supply (VDD) as a dummy collector to prevent CMOS latchup. In the CMOS output buffer, which is directly connected to the output pad, double guard rings for the NMOS and PMOS devices are often specified in the design rules of CMOS technologies to prevent CMOS latchup (because the external overshooting/undershooting voltage waveforms could trigger on the parasitic p-n-p-n path in CMOS IC's to cause latchup problems). The suitable spacing for latchup guard rings is denoted as "s1" This spacing is process dependent, and is specified in the design rules.

In the traditional finger-type layout, however, there is an important spacing denoted as "s2" in FIG. 1. which often degrades ESD robustness of the CMOS output buffer. To explain this s2 spacing, a schematic cross-sectional view along the line B–B' in FIG. 1 is shown in FIG. 3. In FIG. 3, there exists a parasitic diode D1 between the $P^+$ diffusion (connected to GND) and the $N^+$ diffusion of drain. The spacing from the edge of $P^+$ diffusion to the edge of $N^+$ diffusion is marked as s2. If the spacing s2 is too small, the diode D1 will first be broken down to bypass ESD current by a positive ESD voltage on the output pad, before the NMOS drain is broken down. Because the edge of drain on this side is much shorter than that of drain to its source side, this diode D1 is very weak to ESD stress if s2 is too small. Thus, in the layout with consideration of ESD reliability, this spacing s2 had better be greater than the spacing from the drain-contact edge to source-contact edge. With bigger spacing s2, the NMOS drain will first be broken down to bypass ESD current from the drain to its source rather than through the diode D1. Thus, the ESD robustness of NMOS device in the output buffer could not be degraded by this parasitic diode D1, but the total layout area will be increased.

SUMMARY OF THE INVENTION

The present invention is an electronic device which includes: a first looped part having an inner circumference, a second part located within the inner circumference and separated from the first looped part and a third looped part positioned between the first and second parts for conducting the first and second parts in a first instance and for insulating the first and second parts in a second instance. The present invention is more particularly an MOS transistor fabricated on a semiconductor substrate, where the first part is a source region, the second part is a drain region and the third part is a gate. While the second part can be either square or squared loop in shape, the first and third parts are both squared loop in shape. Such MOS transistors can be assembled to preferably form a bigger, substantially rectangular (including the special case of square) and similarly functioning transistor.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
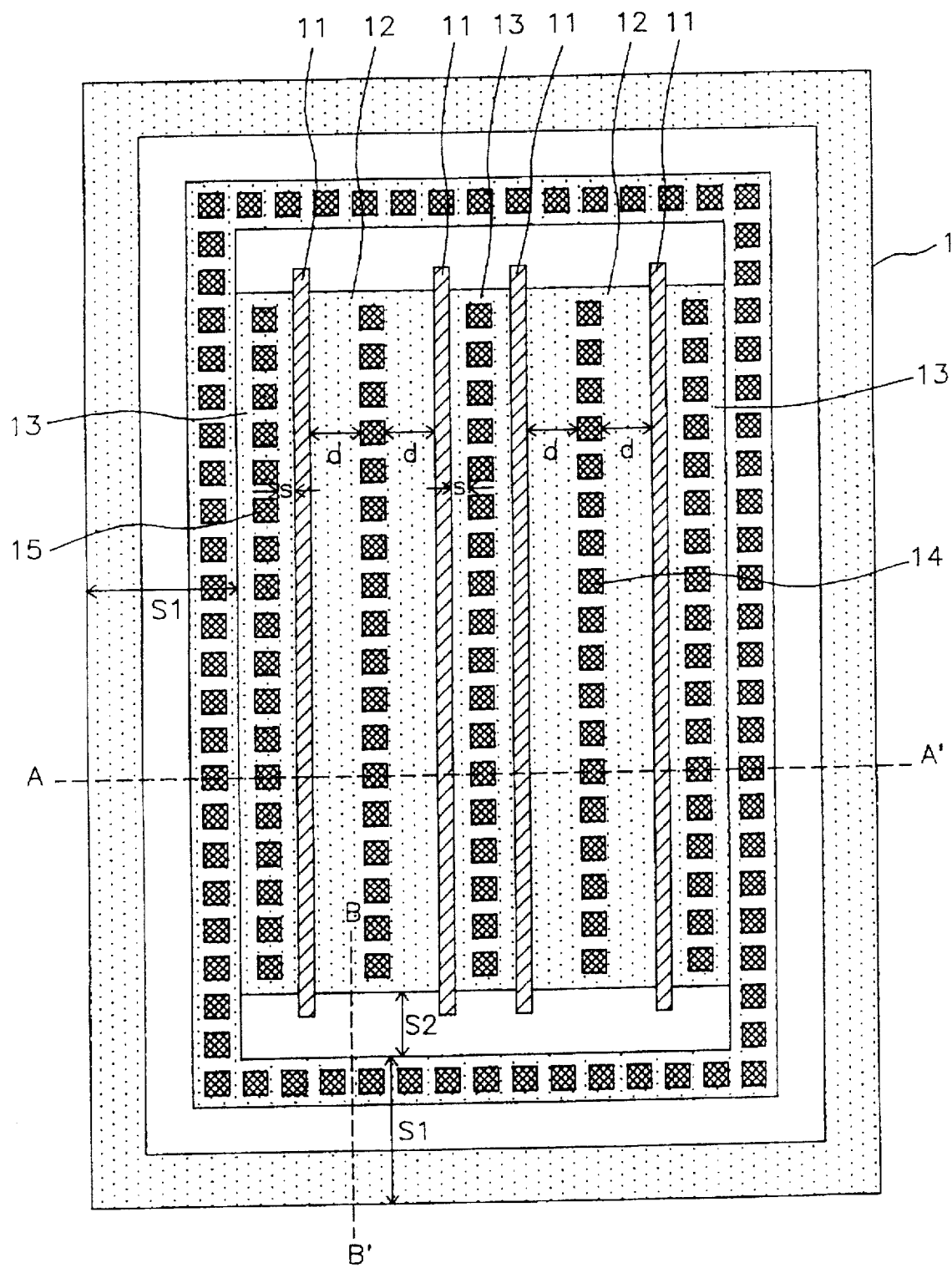
FIG. 1 shows a traditional finger-type layout for an NMOS device.
Figure 2:
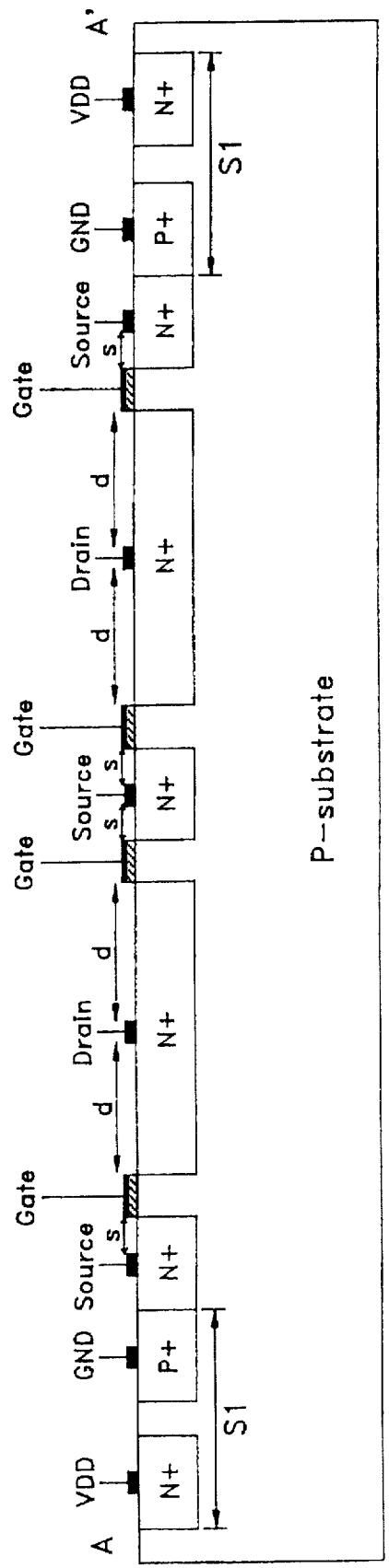
FIG. 2 shows the schematic cross-sectional view along the line A–A' in FIGS. 1 and 4.
Figure 4:
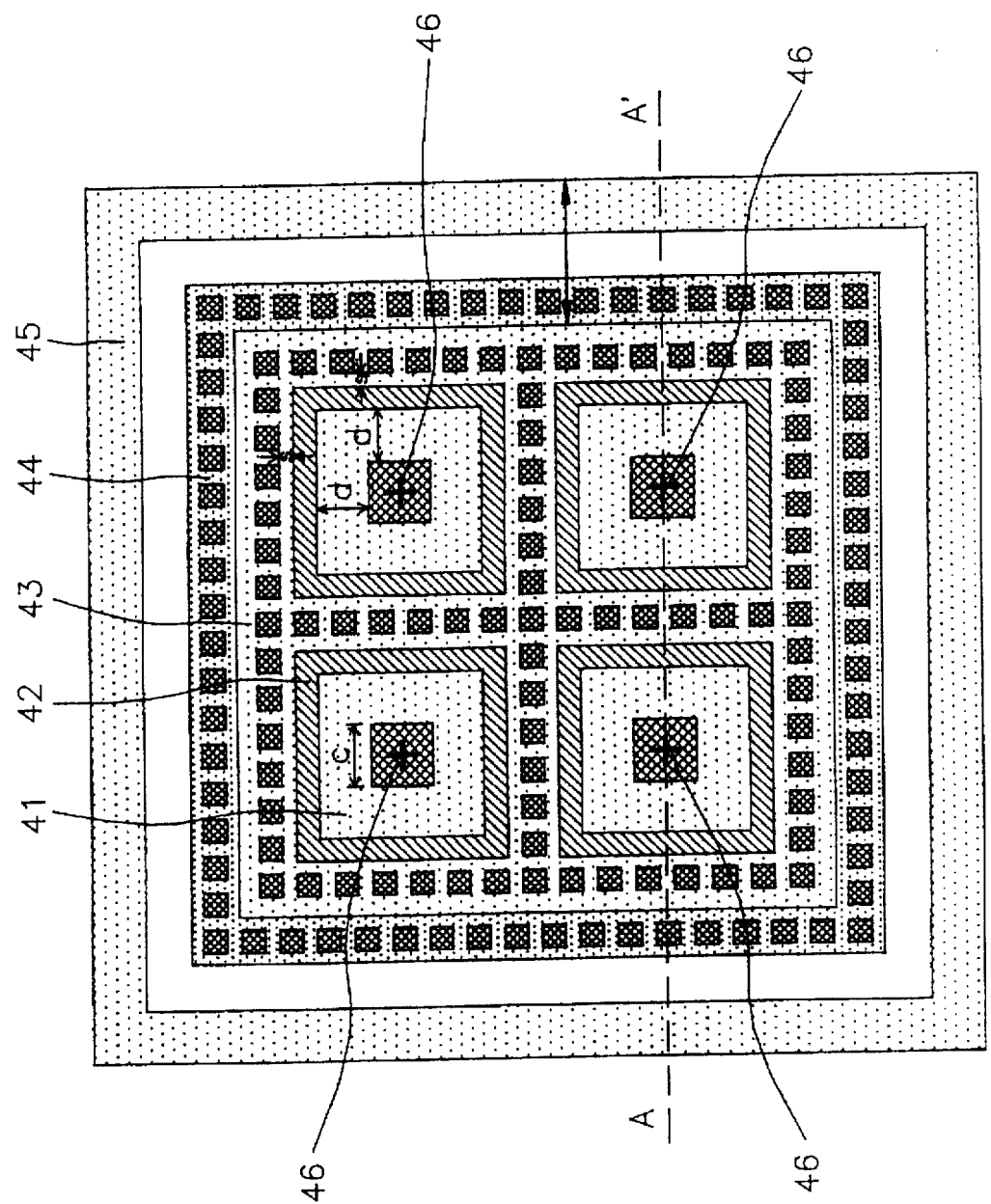
FIG. 4 is a square-type layout for an NMOS device.

To reduce total layout area to cut cost and to eliminate the problem caused by the parasitic diode D1 in the traditional finger-type layout of CMOS output transistors, a new square-type layout style is proposed in this invention. The schematic layout of a square-type style for NMOS device is shown in FIG. 4. The schematic cross-sectional view along the line A–A' FIG. 4 is the same as that shown in FIG. 2, where the n-well/p-substrate CMOS process is used to demonstrate this invention. The present square-style layout can be implemented by any CMOS or BiCMOS technologies including p-well/n-substrate, n-well/p-substrate or twin-well (or twin-tub) processes. This invention can be also used to implement the PMOS devices. In FIG. 4, there are four small-dimension square cells to form a large-dimension NMOS device. Each small dimension square cell is identical to one another. The black square region 46 with side length of "c" in the center of a square cell is the contact for metal connected to the $N^+$ drain diffusion 41 of an NMOS device. The gate (42) made by polysilicon in each square cell is also drawn in square-loop style. The $N^+$ source diffusion 43 is also in square-loop style and surrounds the gate and drain regions. The contacts at the source side of the NMOS device are placed in square-style arrangement. Outside the NMOS device, there is a $P^+$ diffusion 44 in p-substrate connected to ground to offer p-substrate bias for normal CMOS operation. Referring to FIG. 1, the spacing from the drain contact 14 of the drain region 12 works as a latchup guard ring for the NMOS device used in an output buffer. All the layout elements in a square cell, including the placement of contacts, should be made as symmetric as possible to ensure uniform current flow in the NMOS device so as to increase its ESD protection capability. With the present layout technique, there is no spacing s2 in this square-type layout. The layout area due to spacing s2 in the traditional finger-type layout can be saved. Moreover, there is no parasitic diode D1 at the edge of the drain region 41, so the ESD robustness of output devices is not degraded.

In FIG. 4, the NMOS device is demonstrated by four basic square cells. Since a square is considered to be a special case of rectangle, a bigger NMOS device in the shape of rectangle (including the special case of square) can be assembled by the basic square cells. The number of square cells can be designed for different device dimensions (W/L ratios).

The structure shown in FIG. 4 is for the thin-oxide NMOS device. This layout style is also applicable to the i-oxide PMOS device.

Figure 3:
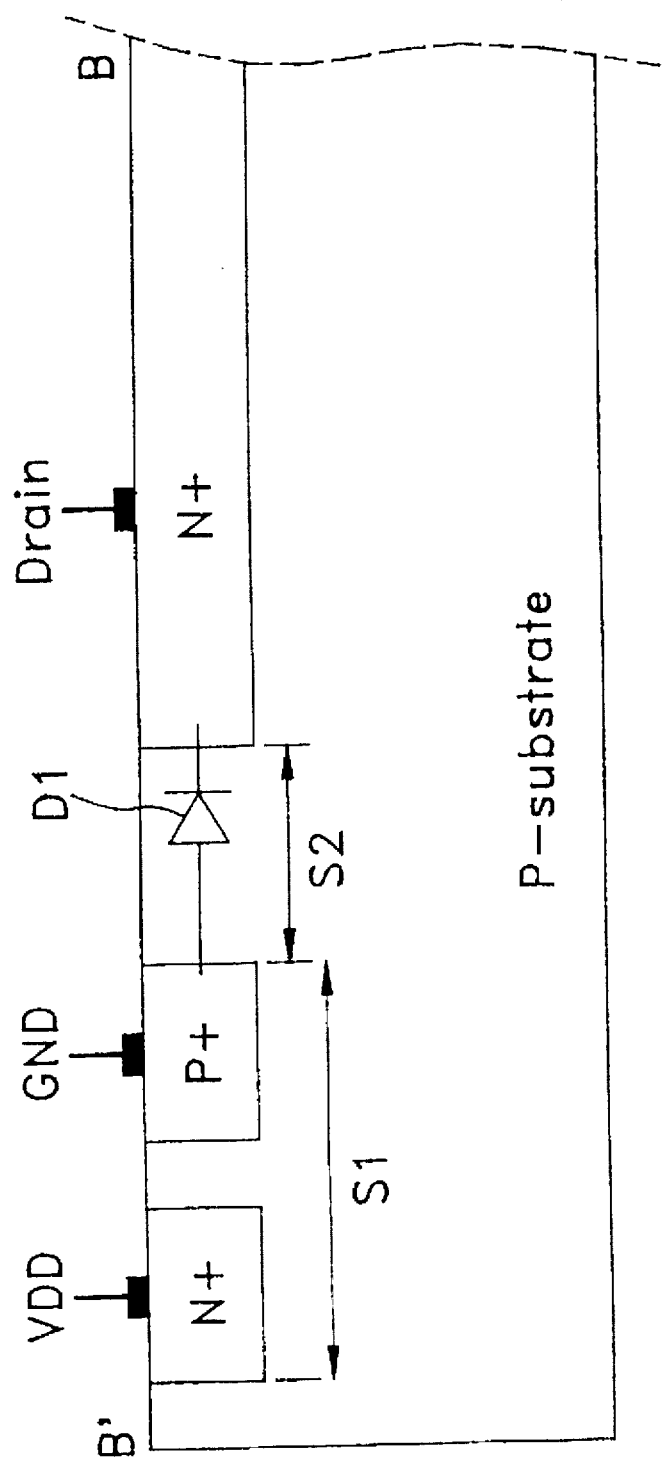
FIG. 3 shows the schematic cross-sectional view along the line B–B' in FIG. 1.
Figure 5:
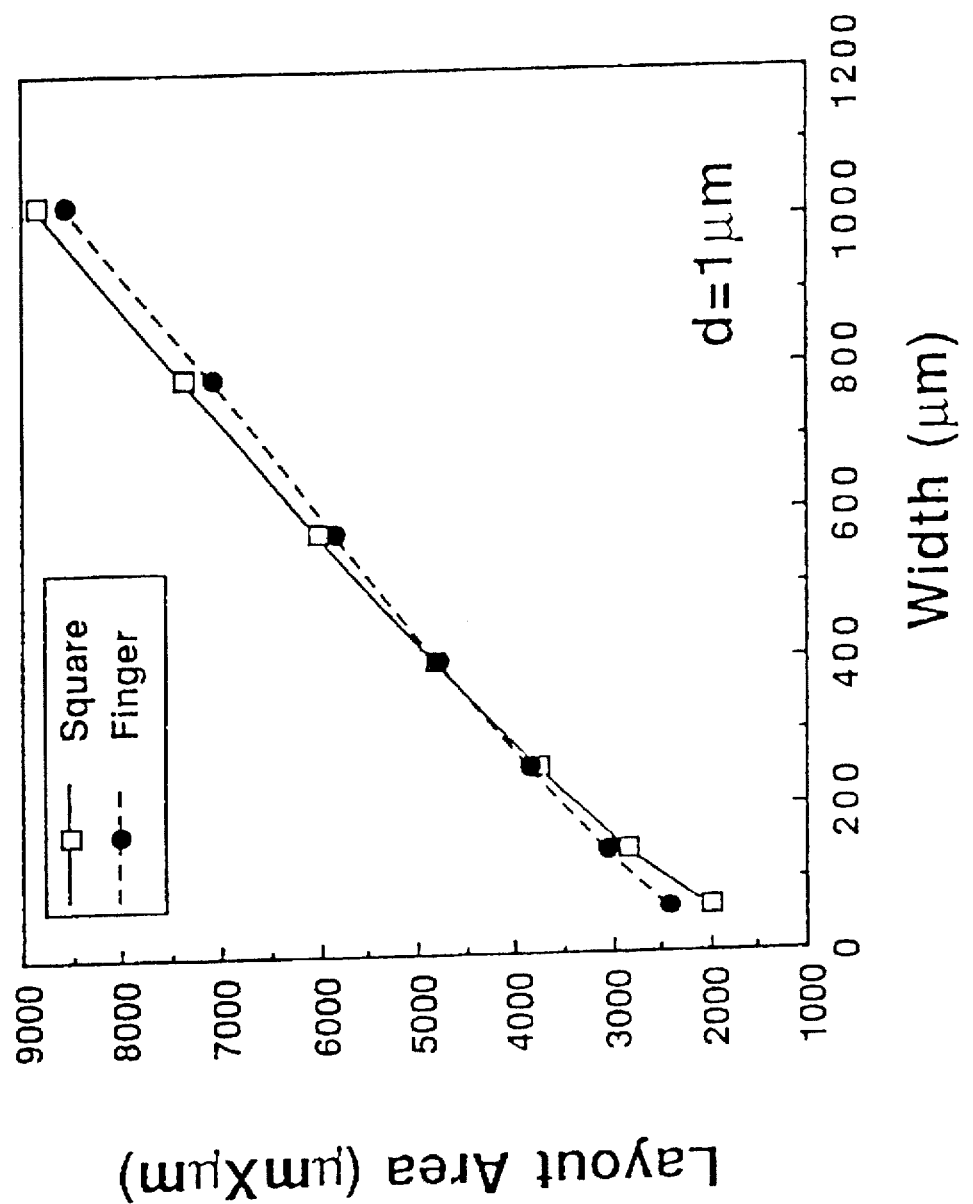
FIG. 5 shows a comparison of the total layout area between the traditional finger-type layout and the present square-type layout where the spacing d is 1 μm.

To verify the area-reducing efficiency of this invention, comparisons of total layout area between the traditional finger-type layout and the present square-type layout are made under different layout parameters. FIG. 5 shows a comparison of total layout area between the traditional finger-type layout and the present square-type layout under the spacing "d" (drain contact to ploy-gate edge) of 1 μm. The total layout area includes the double latchup guard rings with "s1" of 14.2 μm in both the traditional finger-type layout and the present square-type layout. In the square-type layout, the edge length "c" of the drain contact is 2 μm. In the traditional finger-type layout, the extra spacing of "s2" (shown in FIGS. 1 and 3) is 4 μm. The length of each poly finger in the traditional finger-type layout is equal to one another, and is ranged between 25 μm and 50 μm in most submicron CMOS design rules for better ESD reliability in the finger-type layout. In FIG. 5, the device length (L) is fixed to 1 μm in both the finger-type and the square-type layout for comparison. It is shown in FIG. 5 that the area of the square-type layout with larger device width (W) is not significantly reduced as compared to that of the finger-type layout, with the spacing "d" equal to 1 μm.

Figure 6:
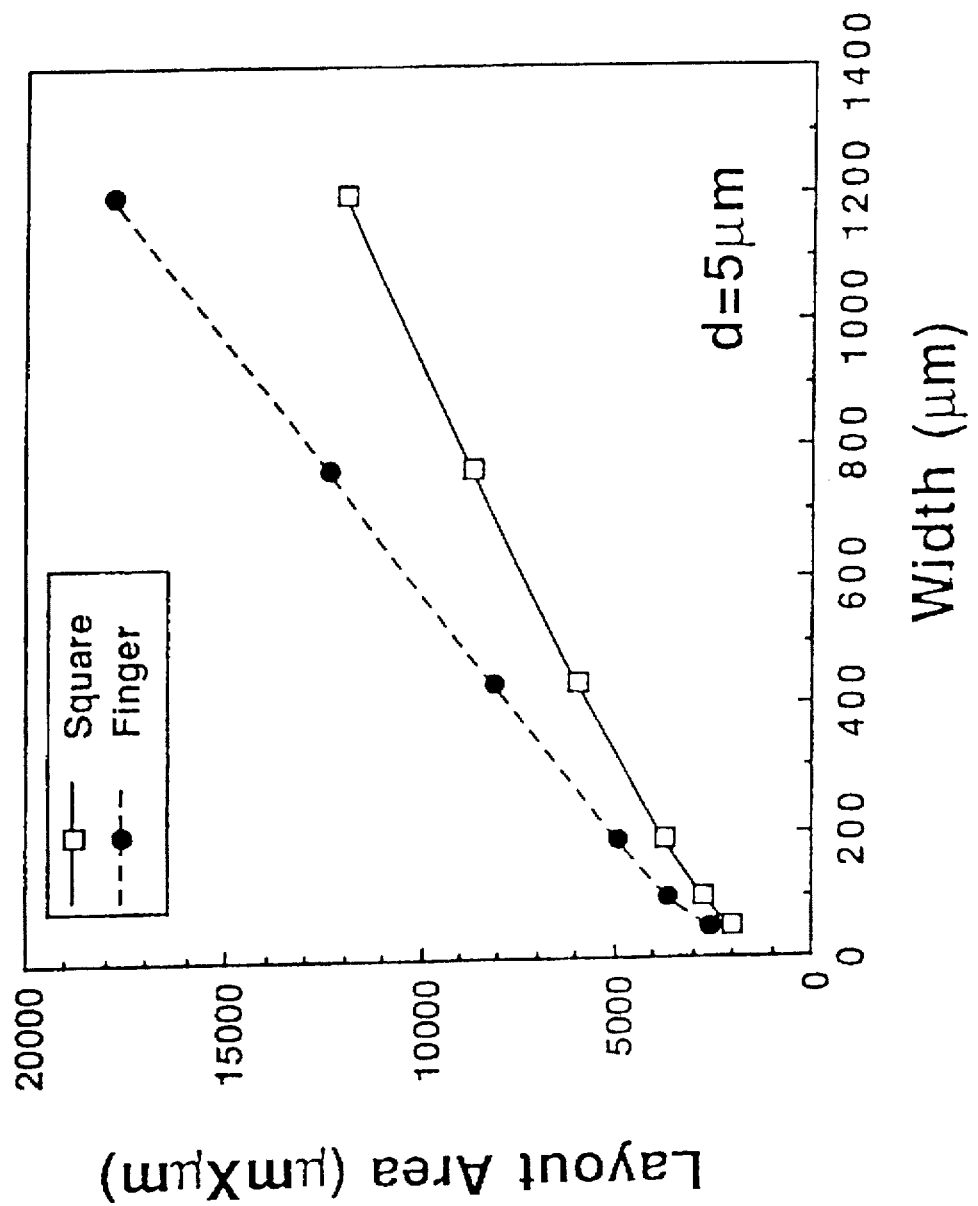
FIG. 6 shows a comparison of the total layout area between the traditional finger-type layout and the present square-type layout where the spacing d is 5 μm.

But in FIG. 6, as the spacing "d" is increased to 5 μm, which is often required in most submicron CMOS design rules, the area of the square-type layout with larger device width (W) is significantly reduced as compared to that of the finger-type layout. In FIG. 6, as the device dimension W/L is 432 μm/1.0 μm, the total layout area in the traditional finger-type layout is about 8151 μm², but that in the square-type layout is only 5929 μm². This shows excellent improvement on the area-reduction of the square-type layout, about 30% reduction on the total layout area compared to the finger-type layout.

Figure 7:
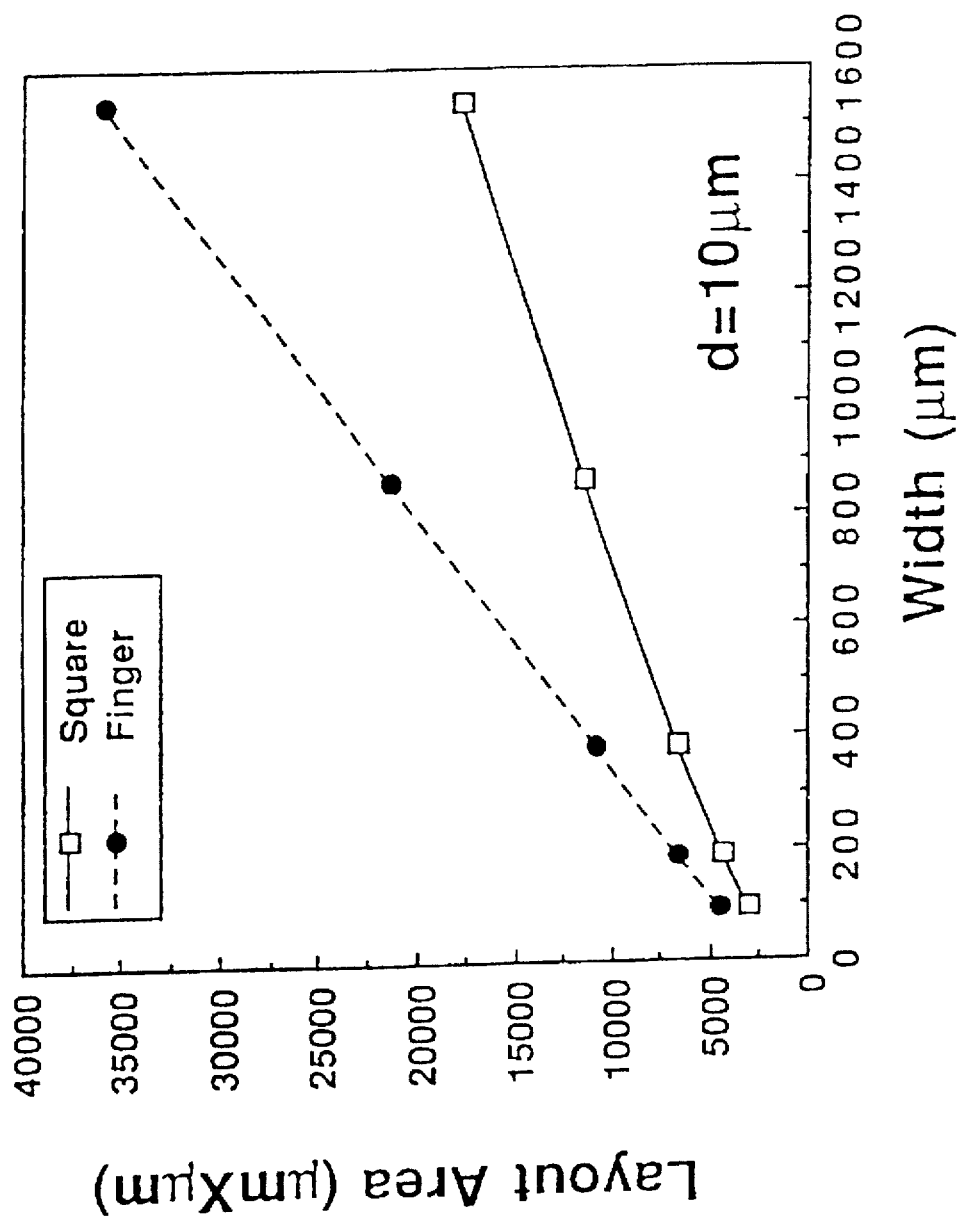
FIG. 7 shows a comparison of the total layout area between the traditional finger-type layout and the present square-type layout where the spacing d is 10 μm.

In FIG. 7, as the spacing "d" is increased to 10 μm, the area reduction in the square-type layout is more obvious. In FIG. 7, as the device dimension (W/L) is 384 μm/1.0 μm, the total layout area in the traditional finger-type layout is about 10769 μm², but that in the square-type layout is only 6528 μm². This verifies the excellent reduction effect of the present square-type layout on the total layout area.

Figure 8:
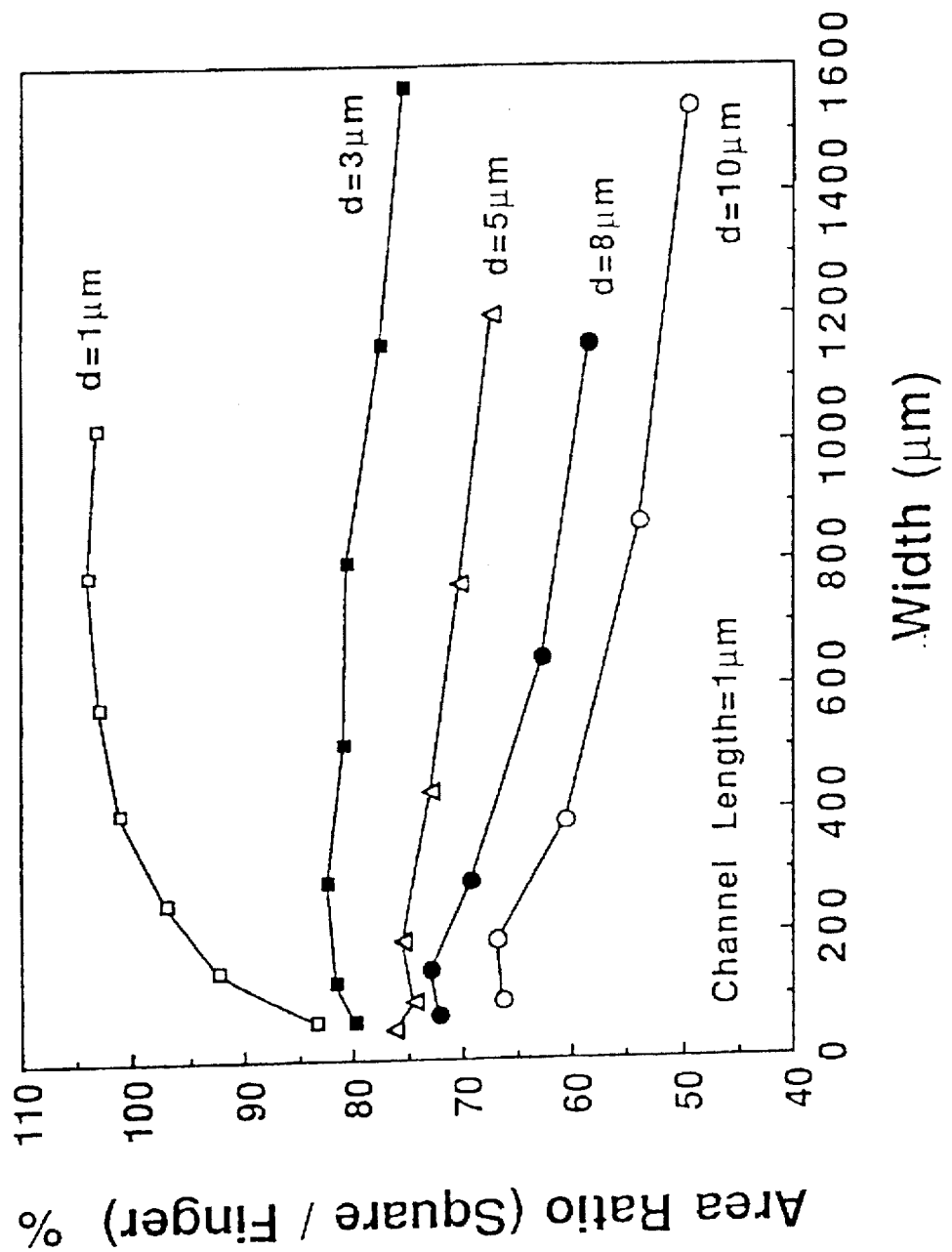
FIG. 8 shows the relations between the device width (W) and the ratio (%) of the square-type area to the finger-type area with different spacings of d.

FIG. 8 shows the relations between the device width (W) and the ratio (%) of the square-type area to the finger-type area under different spacing of "d". It is clearly shown that the square-type layout technique can significantly reduce the total layout area, as the spacing "d" is required to be larger. This shows the excellent advantage of layout area reduction to save cost of IC's in submicron CMOS technologies.

Figure 9:
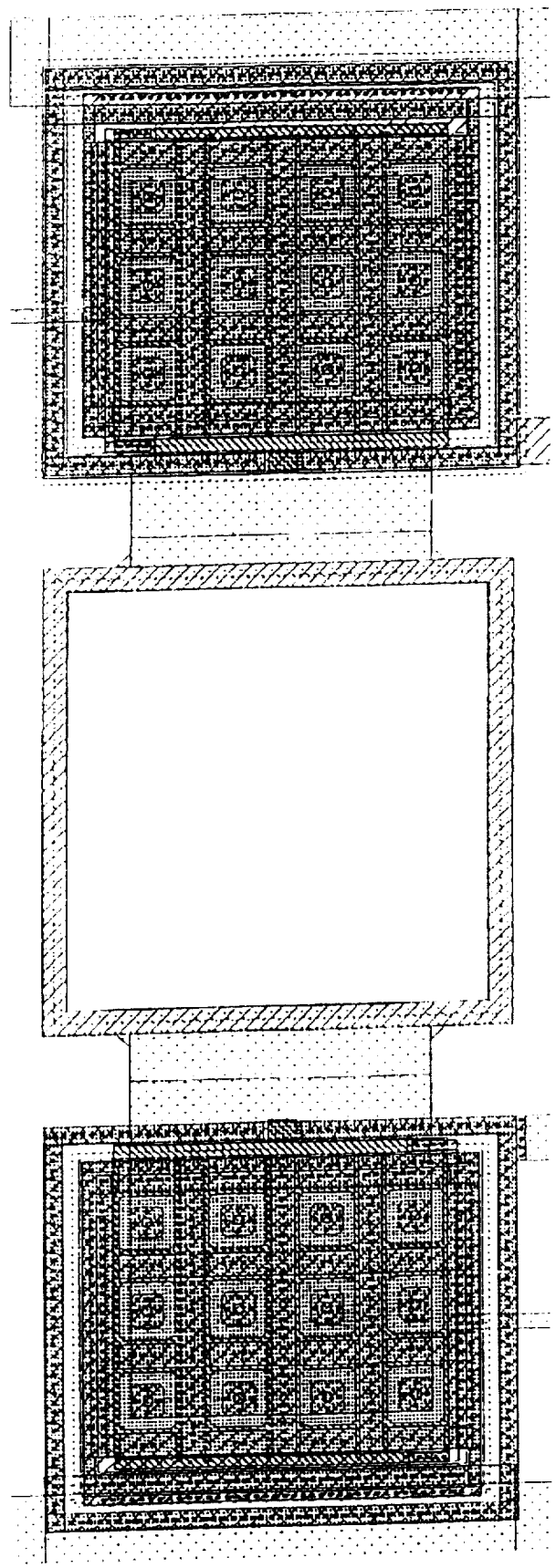
FIG. 9 shows a practical square-type layout of an output pad with a CMOS output buffer and latchup guard rings, which is realized by a 0.6 μm twin-well/P-substrate double-poly-double-metal CMOS technology.
Figure 10:
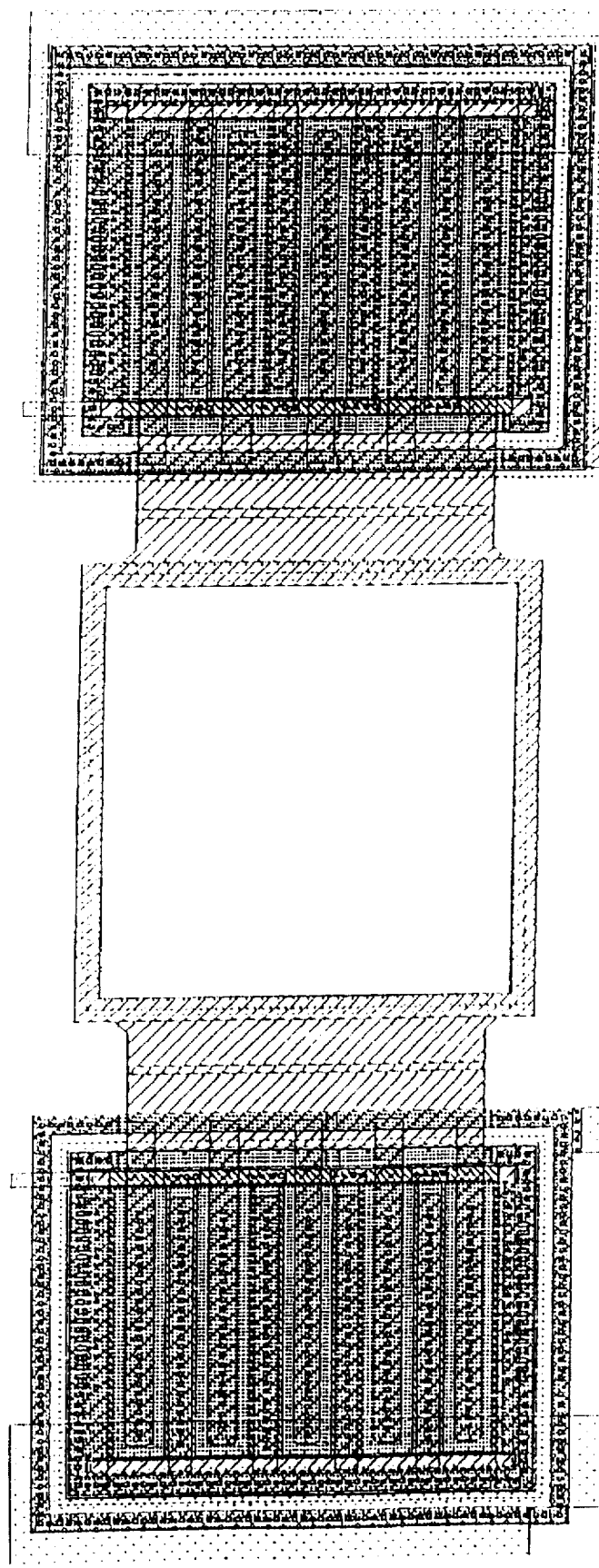
FIG. 10 shows a traditional finger-type layout with dimension of W/L=530 μm/1.0 μm.

A practical square-type layout of an output pad with a CMOS output buffer and latchup guard rings, which is realized by a 0.6 μm twin-well/P-substrate double-poly-double-metal CMOS technology, is shown in FIG. 9. There are 12 basic NMOS (PMOS) square cells used to assemble the NMOS (PMOS) device of an output buffer with total device dimension of W/L=576 μm/1.0 μm. A traditional finger-type layout with dimension of W/L=530 μm/1.0 μm is shown in FIG. 10 for comparison of layout efficiency. In FIG. 9 and FIG. 10, the spacings d from the drain contact to poly-gate edge in both cases are 5 μm, and the spacings s from the source contact to poly-gate are both selected as 2.2 μm. For PMOS device, the layout area is 9999.25 μm² for finger-type and 8805.08 μm² for square-type. For NMOS device, the layout area is 10792.46 μm² for finger-type and 9564.31 μm² for square-type. The square-type layout can save about 12% of area to realize an NMOS (PMOS) device with W/L=576 μm/1.0 μm as compared with the finger-type layout with W/L=530 μm/1.0 μm; i.e., in the case of the same W/L, the square-type layout will save more than 12% of area as compared to the finger-type layout. If the spacings s from the source contact to the poly-gate edge are both further reduced to only 1 μm, the square-type layout area can be reduced further. Thus, by using the basic square cell to build the output buffer, we can save a lot of space for the entire chip.

Figure 11:
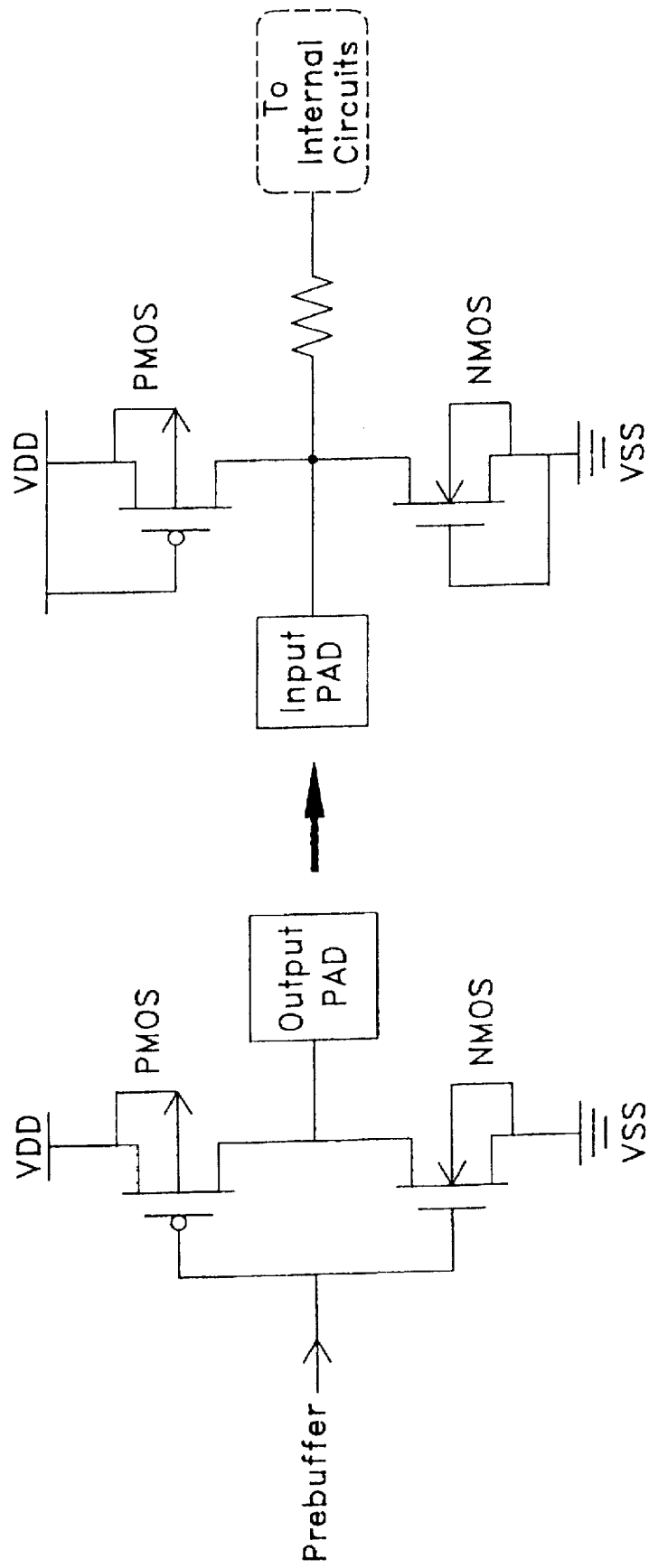
FIG. 11 shows the modification of the CMOS output buffer to become a CMOS input ESD protection circut.

Besides, this invention can also be applied in the input ESD protection circuit. If the gate of NMOS (PMOS) in the CMOS output buffer is shorted to ground (VDD), the output buffer can be used as an input ESD protection circuit. FIG. 11 shows the modification of the CMOS output buffer to become a CMOS input ESD protection circuit. The square cell can also be used to implement the thin-oxide NMOS and PMOS devices in CMOS input ESD protection circuit to save total layout area of an input pad. By applying this invention to input and output pins of a high-pin-count CMOS IC, the total layout area of the entire chip can be significantly reduced.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge protected device formed on a substrate, comprising:

a first part being loop-shaped;

a second part located in and separated from the first looped part;

a third part being loop-shaped and positioned between the first and second parts for conducting the first and second parts in a first instance and for isolating the first and second parts in a second instance;

a loop-shaped inner diffusion area for biasing the substrate, said inner diffusion area surrounding said first, second and third parts, and being the same diffusion type as the substrate: and a loop-shaped outer diffusion area working as a latchup guard ring, said outer diffusion area surrounding said loop-shaped inner diffusion area, and being of an opposite diffusion type than the substrate.

2. A device as set out in claim 1 wherein the substrate comprises a semiconductor substrate and said device comprises a MOS transistor fabricated on said semiconductor substrate.

3. A device according to claim 2 wherein said first instance is an on state and said second instance is an off state.

4. A device according to claim 3 wherein said first, second and third parts are positioned symmetrically with respect to a central line.

5. A device as set out in claim 4 wherein said second part is a drain region which is square in shape; said third part is a gate region surrounding said drain region and formed into a squared loop; and said first part is a source region, formed into a squared loop, and surrounds said gate region and said drain region, in which said inner diffusion and said outer diffusion are formed into square loops.

6. A device as set out in claim 5 comprising a plurality of MOS transistors assembled to form a larger, square and similarly functioning device.

7. A device as set out in claim 5 comprising a plurality of MOS transistors assembled to form a larger, rectangular and similarly functioning device.

8. A device as set out in claim 1 wherein said device comprises a NMOS device, said inner diffusion is a $P^+$ diffusion to be electrically connected to ground and said outer diffusion is an $N^+$ diffusion to be electrically connected to a voltage supply.

9. A device as set out in claim 1 wherein said device comprises a PMOS device, said inner diffusion is an $N^+$ diffusion to be electrically connected to a voltage supply and said outer diffusion is a $P^+$ diffusion to be electrically connected to ground.

* * * * *

UNITED STATES PATENT AND TRADEMARK OFFICE
CERTIFICATE OF CORRECTION

PATENT NO. : 5,714,784
DATED : February 3, 1998
INVENTOR(S) : Ming-Dou Ker; Chung-Yu Wu; Chien-Chang Huang; Chau-Neng Wu; Ta-Lee Yu It is certified that error appears in the above-indentified patent and that said Letters Patent is hereby corrected as shown below:

Column 1, line 48, after "style" change "wig" to -- within --.
Column 2, line 4, before "increase" delete "without much".
Column 2, line 7, change "5–µm" to -- 5–6 µm --.
Column 2, lines 33-37, after "process." delete "This P⁺ diffusion 44 surrounds the entire NMOS device. There is an N⁺ diffusion 45 surrounding this P⁺ diffusion 44 and connected to a voltage supply (VDD). This N⁺ diffusion 45 to the poly-gate edge is "d".", and insert therefor -- Referring to FIG. 1, the spacing from the drain contact 14 of the drain region 12 to the poly-gate edge is "d". --.
Column 2, line 55, after "s1" insert a period.
Column 4, line 12, after "A-A'" insert -- in --.
Column 4, lines 31-32, delete "Referring to FIG. 1, the spacing from the drain contact 14 of the drain region 12", and insert therefor -- This P⁺ diffusion 44 surrounds the entire NMOS device. There is an N⁺ diffusion 45 surrounding this P⁺ diffusion 44 and connected to a voltage supply (VDD). This N⁺ diffusion 45 --.
Column 4, line 51, change "i-oxide" to -- thin-oxide --.

Signed and Sealed this

Twenty-sixth Day of January, 1999

Attest:

Attesting Officer

*Acting Commissioner of Patents and Trademarks*